United States Patent
Chen et al.

(10) Patent No.: US 10,043,653 B2
(45) Date of Patent: Aug. 7, 2018

(54) MARANAGONI DRY WITH LOW SPIN SPEED FOR CHARGING RELEASE

(75) Inventors: Wei-Cheng Chen, Kaohsiung (TW); Ling-Sung Wang, Tainan (TW); Chih-Hsun Lin, Tainan (TW); Tzu kai Lin, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 754 days.

(21) Appl. No.: 13/595,787

(22) Filed: Aug. 27, 2012

(65) Prior Publication Data

US 2014/0053869 A1 Feb. 27, 2014

(51) Int. Cl.
| | |
|---|---|
| *B08B 3/02* | (2006.01) |
| *H01L 21/02* | (2006.01) |
| *H01L 21/67* | (2006.01) |
| *C11D 11/00* | (2006.01) |
| *C11D 7/26* | (2006.01) |

(52) U.S. Cl.
CPC ........ *H01L 21/02052* (2013.01); *C11D 7/261* (2013.01); *C11D 11/0047* (2013.01); *H01L 21/67028* (2013.01)

(58) Field of Classification Search
CPC ......... H01L 21/67028; H01L 21/02052; H01L 21/67051; H01L 21/67034; C11D 11/0047; C11D 7/267
USPC ................................ 134/6, 26, 33
See application file for complete search history.

(56) References Cited

U.S. PATENT DOCUMENTS

| | | | |
|---|---|---|---|
| 6,770,151 B1* | 8/2004 | Ravkin et al. | 134/33 |
| 2002/0121290 A1* | 9/2002 | Tang et al. | 134/6 |
| 2003/0102017 A1* | 6/2003 | Taniyama | 134/100.1 |
| 2003/0192577 A1* | 10/2003 | Thakur et al. | 134/146 |
| 2004/0194801 A1* | 10/2004 | Verhaverbeke | 134/3 |
| 2006/0260642 A1* | 11/2006 | Verhaverbeke et al. | 134/1.3 |
| 2007/0006904 A1* | 1/2007 | Hagiwara | B08B 3/02 134/198 |
| 2007/0017555 A1* | 1/2007 | Sekiguchi et al. | 134/33 |
| 2007/0246079 A1* | 10/2007 | Pham | H01L 21/67051 134/26 |
| 2008/0314870 A1* | 12/2008 | Inoue et al. | 216/38 |
| 2009/0165819 A1* | 7/2009 | Hayamizu | B08B 3/08 134/10 |
| 2010/0154837 A1* | 6/2010 | Ogawa | B08B 3/02 134/32 |

FOREIGN PATENT DOCUMENTS

| | | | |
|---|---|---|---|
| KR | 20110095170 | * | 8/2011 |
| TW | 200630579 | | 9/2006 |
| TW | 200631061 | | 9/2006 |
| TW | 200818283 | | 4/2008 |

* cited by examiner

*Primary Examiner* — Katelyn B Whatley
(74) *Attorney, Agent, or Firm* — Slater Matsil, LLP

(57) ABSTRACT

A method of cleaning and drying a semiconductor wafer including inserting a semiconductor wafer into a chamber of a cleaning tool, spinning the semiconductor wafer in a range of about 300 revolutions per minute to about 1600 revolutions per minute, and simultaneously spraying the semiconductor wafer with de-ionized water and a mixture of isopropyl alcohol and nitrogen.

22 Claims, 4 Drawing Sheets

MARANAGONI DRY WITH LOW SPIN SPEED FOR CHARGING RELEASE

BACKGROUND

Semiconductor wafers may be manufactured using a chemical vapor deposition (CVD) process. In such a process, the silicon structure of a typical semiconductor wafer is built-up using Silane ($SiH_4$) and semiconductor properties are created by interstitially depositing elements such as Arsenic and Phosphorous. The sources for these elements, commonly called doping agents, may be the hydrides Arsine ($AsH_3$) and Phosphine ($PH_3$). These doping agents are pyrophoric and toxic. Therefore, the doping agents are scrubbed away when the semiconductor wafers are evacuated from a CVD reactor.

In addition to the above, semiconductor wafers may be subjected to Chemical Mechanical Processing (CMP) during fabrication. After such a process is performed, contaminants may remain on the wafer. Like the doping agents, these contaminants may be scrubbed away prior to further semiconductor wafer processing steps.

In order to remove the doping agents or the contaminants, a scrubber tool may be employed. The conventional scrubber tool generally cleans and/or dries the semiconductor wafer using a high speed spin process. The high speed spin process may involve spinning the wafer at, for example, about 2,400 revolutions per minute (rpm). Unfortunately, the high speed spin process tends to induce charge in the wafer, which may lead to wafer damage. In addition, the high speed spin process makes precisely controlling a water spray difficult. This may lead to a low particle clean rate.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present invention will be described with respect to embodiments in a specific context, namely methods of cleaning and/or drying a semiconductor wafer during semiconductor fabrication. The concepts in the disclosure may also apply, however, to other methods or cleaning tools incorporated in processes relating to the semiconductor or other industries.

Figure 1:
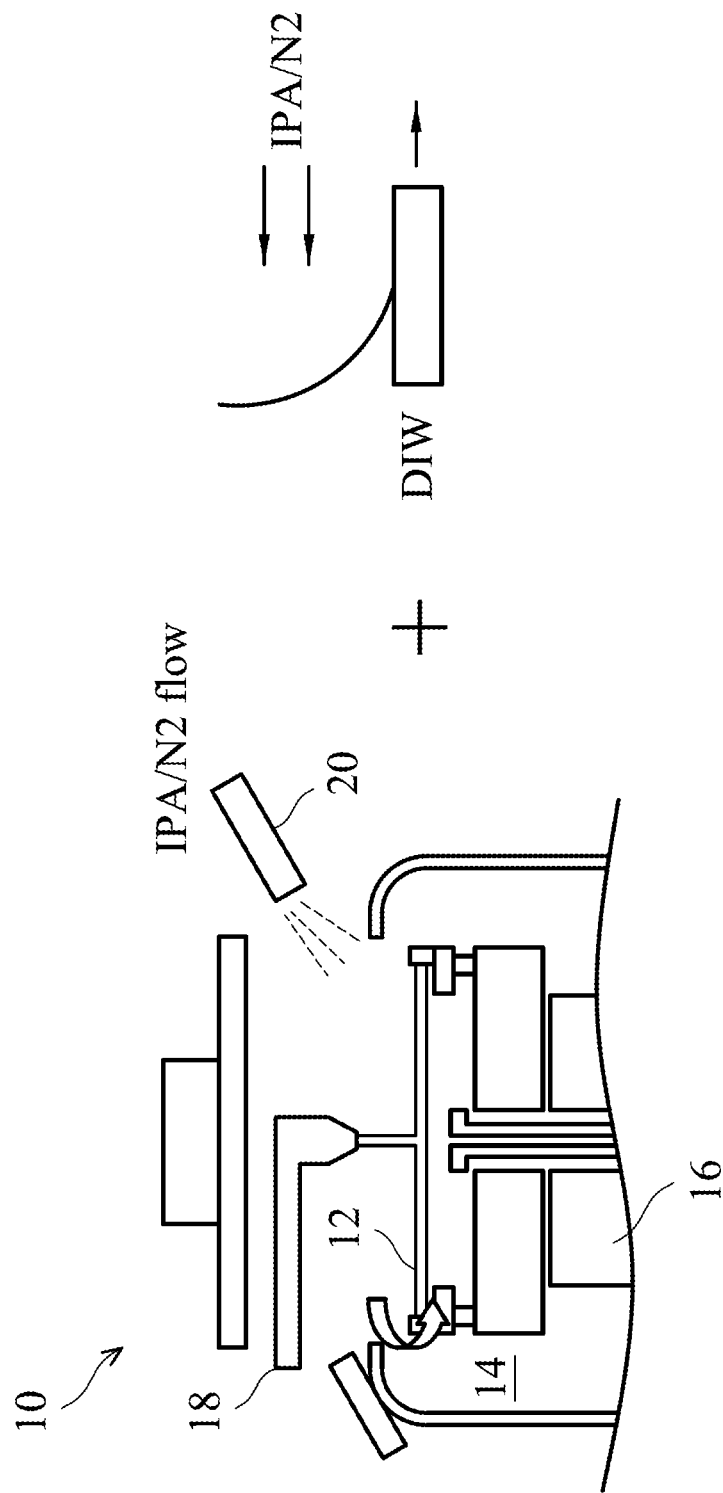
FIG. 1 is a schematic representation of an embodiment cleaning tool suitable for cleaning and drying a semiconductor wafer.
Figure 2:
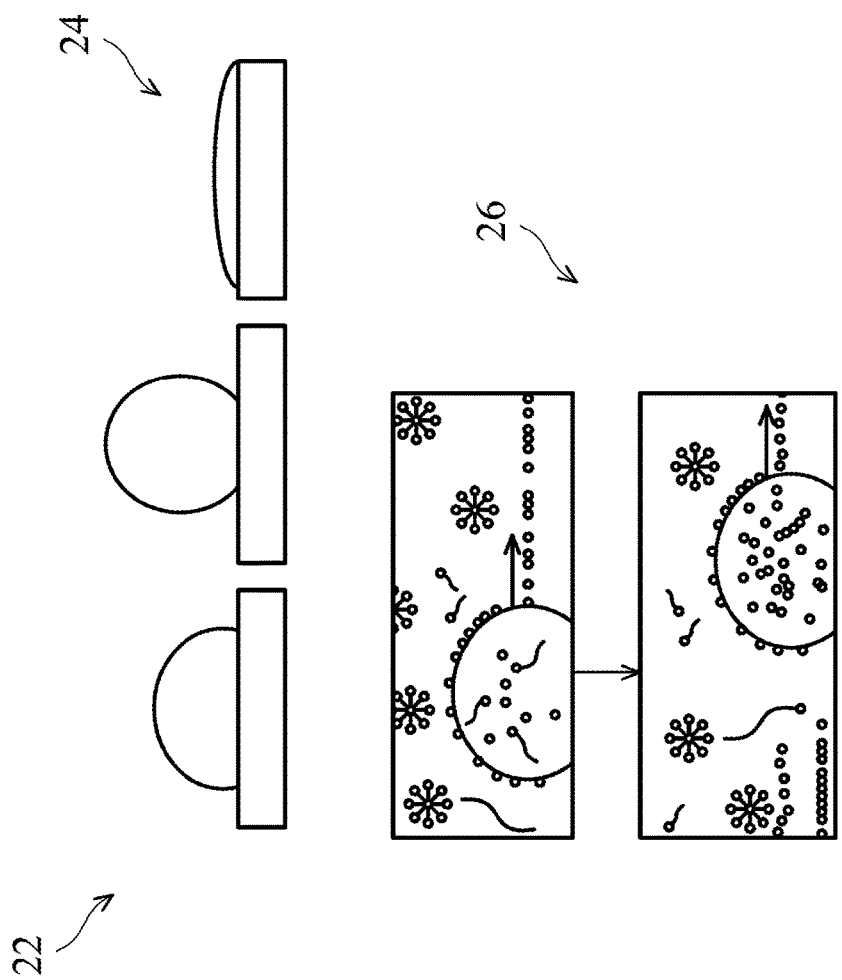
FIG. 2 is a schematic representation of the Marangoni effect employed by the cleaning tool of FIG. 1.

With reference now to FIG. 1, a schematic representation of an embodiment cleaning tool 10 suitable for cleaning and drying a semiconductor wafer 12 is depicted. As shown, the cleaning tool 10 includes a chamber 14 configured to receive one or more of the semiconductor wafers 12. For ease of illustration, a single one of the semiconductor wafers is depicted in the cleaning tool 10 in FIG. 1. Even so, it should be recognized that several semiconductor wafers 12 may be loaded into the chamber 14 simultaneously in some embodiments.

As shown in FIG. 1, the cleaning tool 10 is equipped with a drive mechanism 16 configured to rotate the semiconductor wafer 12 when operated. In an embodiment, the drive mechanism 16 rotates the semiconductor wafer 12 in a range of about 300 revolutions per minute (RPMs) to about 1600 revolutions per minute. In an embodiment, the drive mechanism 16 is unable to rotate the semiconductor wafer 12 at speeds in excess of about 2400 revolutions per minute.

Still referring to FIG. 1, the cleaning tool 10 is equipped with a first inlet 18 and a second inlet 20. In an embodiment, the first inlet 18 is configured to spray de-ionized water (i.e., DIW or DI water) onto the semiconductor wafer 12. As shown, in an embodiment the first inlet 18 is generally disposed in the center of the chamber 14. Even so, the first inlet 18 may be otherwise located or positioned in other embodiments.

In an embodiment, the second inlet 20 in the cleaning tool 10 is configured to spray isopropyl alcohol (IPA) or a mixture of isopropyl alcohol and nitrogen (N2) onto the semiconductor wafer 12. In an embodiment, the isopropyl alcohol or the mixture of isopropyl alcohol is sprayed onto the semiconductor wafer 12 simultaneously with the de-ionized water. In an embodiment, the mixture is sprayed on the semiconductor wafer 12 in a range of between about 10 standard liters per minute and about 90 standard liters per minute. In an embodiment, the second inlet 20 may be moved or repositioned within the chamber 14 such that a direction from which the mixture is sprayed on the semiconductor wafer 12 is manipulated or altered. In other words, the mixture may be sprayed on the semiconductor wafer 12 from at different directions, angle, and so on. In an embodiment, the second inlet 20 is moved while the mixture is being sprayed. In an embodiment, the second inlet 20 is moveable before and/or after the spraying has commenced. In an embodiment, more than one of the second inlets 20 may be employed within the chamber 14 of the cleaning tool 10.

In an embodiment, the first inlet 18 and the second inlet 20 are oriented to provide the de-ionized water and the isopropyl alcohol, respectively, side by side. Indeed, the first inlet 18 and the second inlet 20 may move together in order to purge water from a center of the semiconductor wafer 12 to an edge. Even so, in another embodiment the first inlet 18 provides the de-ionized water from the center to the edge of the semiconductor wafer 12 while the second inlet 20 provides the isopropyl alcohol from a different (optimum) angle and/or location. In addition, one or both of the first inlet 18 and the second inlet 20 may move only a short distance to clean a local or small portion of the semiconductor wafer 12, particularly for edge cleaning.

Still referring to FIG. 1, when the mixture of isopropyl alcohol and nitrogen impinges upon the semiconductor wafer 12, which is rotating within the chamber 14 of the cleaning tool 10 due to operation of the drive mechanism 16, a Marangoni cleaning and drying takes place. This is due, at least in part, to the Marangoni effect. The Marangoni effect is the mass transfer along an interface between two fluids due to surface tension gradient. Because a liquid with a high surface tension pulls more strongly on the surrounding liquid than one with a low surface tension, the presence of a gradient in surface tension will naturally cause the liquid to flow away from regions of low surface tension.

By way of example, and as shown in FIG. 1, when the mixture of isopropyl alcohol and nitrogen (IPA/N2) is impinged upon the semiconductor wafer 12, the de-ionized water (DIW) residing on the surface of the semiconductor wafer 12 is pushed toward a periphery of the semiconductor wafer due to the Marangoni effect 22. Indeed, after the de-ionized water on the surface of the semiconductor wafer has been distorted by surface capillarity 24, the mixture of isopropyl alcohol and nitrogen forces the de-ionized water to move laterally 26 along the surface of the semiconductor wafer and surface decontamination is achieved.

Because the de-ionized water is forced toward the edges of the semiconductor wafer 12 by the mixture of isopropyl alcohol and nitrogen as a result of the Marangoni effect, a spin speed of the semiconductor wafer 12 need not be as high in order to suitably clean and/or dry the semiconductor wafer 12. Indeed, an acceptable clean and/or dry may be achieved even when the spin speed for the semiconductor wafer 12 is below about 2400 revolutions per minute.

By taking advantage of the Marangoni effect in the cleaning tool 10 of FIG. 1, the occurrence of plasma induced damage (PID) and wafer defects may be significantly reduced. Moreover, the high-speed spin found in conventional semiconductor wafer cleaning/drying processes easily induces charge. In contrast, the cleaning tool 10 of FIG. 1 uses a much lower spin speed so that the charge is not as easily induced in the semiconductor wafer 12. Also, the particle clean rate is better because the water spray is easier to control at slower spin speeds (i.e., speeds below 2400 RPMs).

Figure 3:
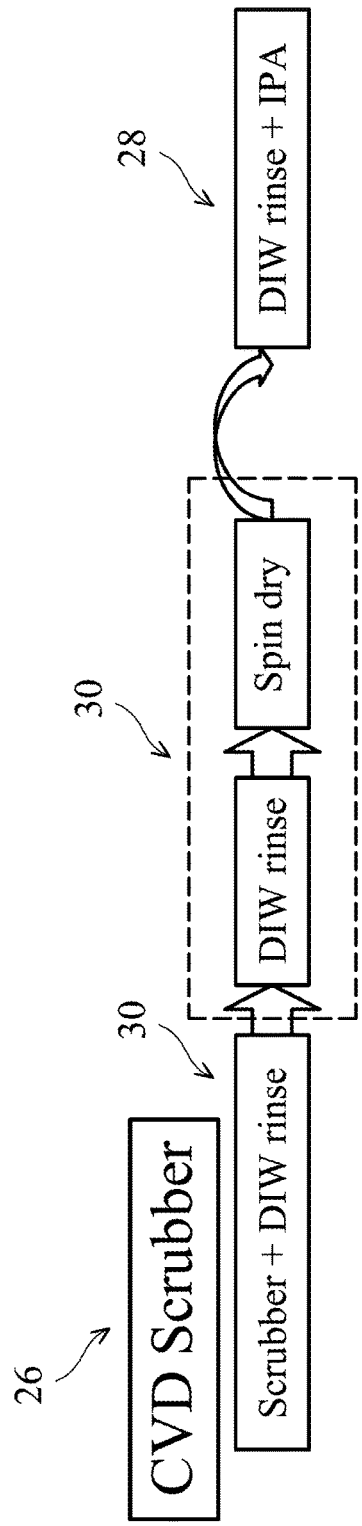
FIG. 3 is a process flow diagram illustrating an embodiment method of cleaning and drying a semiconductor wafer in a chemical vapor deposition (CVD) scrubber process relative to a conventional method of doing the same.

FIG. 3 is a process flow diagram 26 illustrating an embodiment method 28 of cleaning and drying a semiconductor wafer in a chemical vapor deposition (CVD) scrubber process relative to a conventional method 30 (shown in dashed lines) of doing the same. In the conventional method 30, the semiconductor wafer is initially scrubbed and rinsed with de-ionized water while being rotated at about 300 revolutions per minute. Thereafter, the scrubbing is subsequently discontinued and the semiconductor wafer is rinsed with de-ionized water while being rotated at about 300 revolutions per minute. Finally, the semiconductor wafer undergoes a spin dry at about 2400 revolutions per minute.

In contrast to the conventional method 30, in the embodiment method 28 of cleaning and drying the semiconductor wafer is rotated at a range of about 300 revolutions per minute to about 1600 revolutions per minute after the semiconductor wafer 12 is inserted into the chamber 14 of the cleaning tool 10 (FIG. 1). Once in the chamber 14, the semiconductor wafer is simultaneously sprayed with de-ionized water and the mixture of isopropyl alcohol and nitrogen. Notably, the spin speed in the embodiment method 28 is much less than the spin speed used in the conventional method. In an embodiment, the embodiment method 28 may be employed in a chemical vapor deposition (CVD) process using a CVD scrubber.

In another embodiment, a method of cleaning and drying the semiconductor wafer includes inserting the semiconductor wafer into the chamber 14 of the cleaning tool 10 and spinning the semiconductor wafer 12 in a range of about 300 revolutions per minute to about 500 revolutions per minute. While rotating in the chamber 14, the semiconductor wafer 12 is sprayed with the de-ionized water. Thereafter, the flow of de-ionized water is discontinued and the semiconductor wafer is rotated at about 1600 revolutions per minute or less. While rotating, the semiconductor wafer is sprayed with the mixture of isopropyl alcohol and nitrogen.

Figure 4:
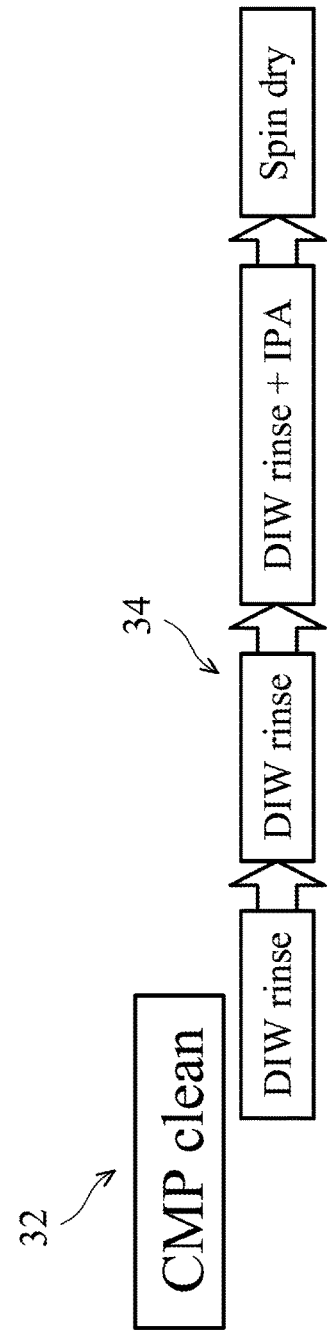
FIG. 4 is a process flow diagram illustrating an embodiment method of cleaning and drying a semiconductor wafer in a chemical mechanical planarization clean (CMP) process.

FIG. 4 is another process flow diagram 32 illustrating an embodiment method 34 of cleaning and drying the semiconductor wafer 12 (FIG. 1). In FIG. 4, the cleaning and drying is part of a chemical mechanical planarization (CMP) clean process. As shown in FIG. 4, after the semiconductor wafer 12 has been inserted into the chamber 14 of the cleaning tool 10 (FIG. 1), the semiconductor wafer is rotated at about 300 revolutions per minute. While spinning, the semiconductor wafer 12 is sprayed with de-ionized water. Thereafter, the semiconductor wafer is rotated at about 1000 revolutions per minute and sprayed with the de-ionized water. In an embodiment, the process of FIG. 4 may also be adapted to a CVD scrubber cleaning or other semiconductor processes.

Next, the semiconductor wafer is again rotated at about 300 revolutions per minute. During this rotation, the semiconductor wafer 12 is sprayed with both de-ionized water and a mixture of isopropyl alcohol and nitrogen. Thereafter, the flow of de-ionized water and the mixture of isopropyl alcohol and nitrogen are discontinued and the semiconductor wafer 12 is rotated in a range of about 1200 revolutions per minute to about 1600 revolutions per minute. In an embodiment, the semiconductor wafer 12 may be rotated at about 1400 revolutions per minute as shown in FIG. 4.

Figure 5:
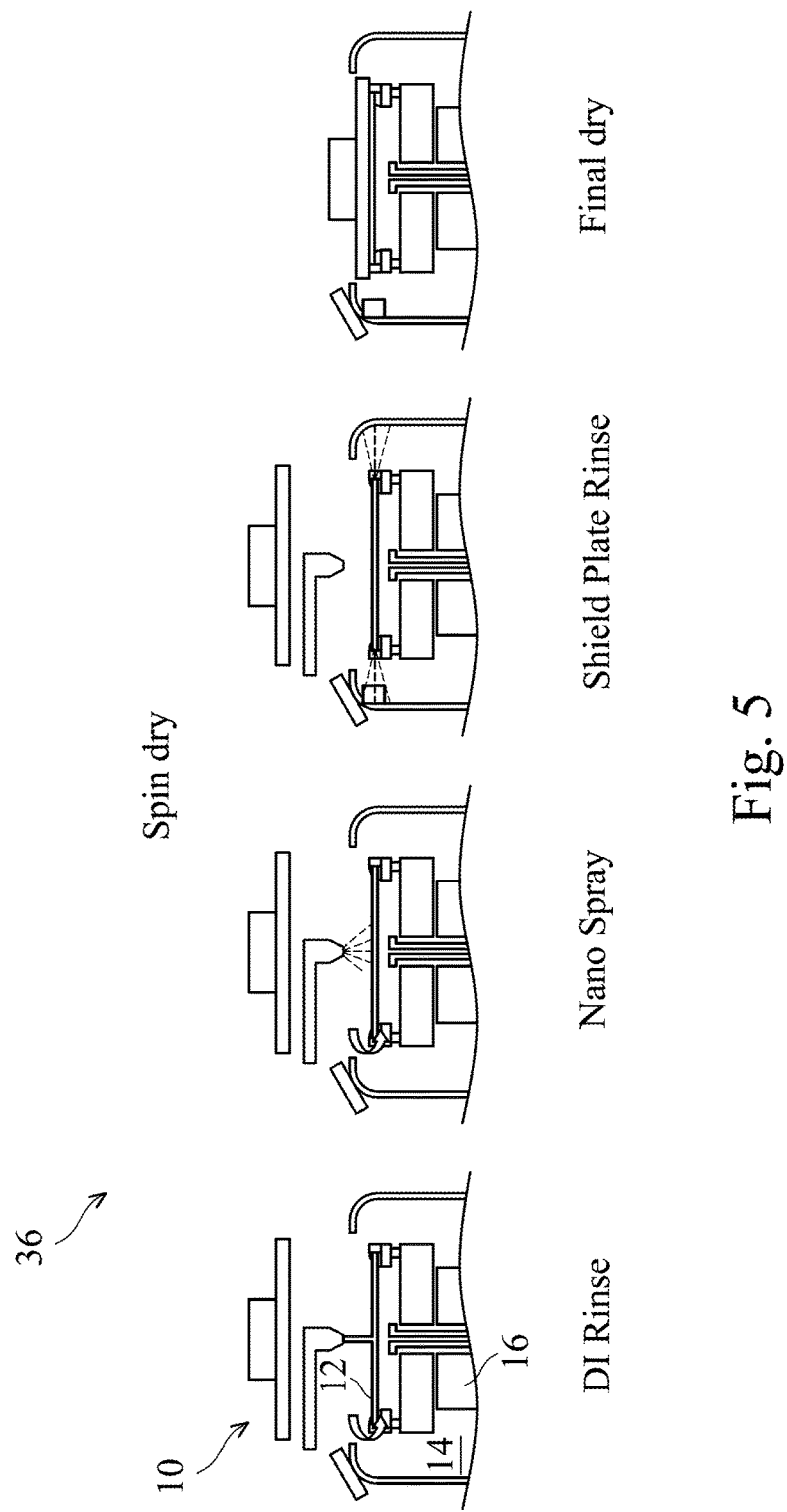
FIG. 5 is a schematic representation of a detailed spin dry process from, for example, the method of FIG. 4.

FIG. 5 is a schematic representation 36 further detailing the spin dry process from, for example, the method of FIG. 4. As shown in FIG. 5, the semiconductor wafer 12 is provided with a deionized water rinse. Thereafter, the semiconductor wafer 12 is subjected to a nano spray such as, for example, the mixture of isopropyl alcohol and nitrogen. Thereafter, the semiconductor wafer 12 is subjected to a shield plate rinse process. In the shield plate rinse, de-ionized water is sprayed onto edges of the semiconductor wafer 12. Next, the semiconductor wafer 12 enters a final dry where the wafer is rotated at about 1200 revolutions per minute to about 1600 revolutions per minute.

In an embodiment, a reduction in spin speed of the semiconductor wafer 12 (FIG. 1) relates to inducement of charge in the semiconductor wafer 12. When the lower spin speed (i.e., about 1500 RPMs) of the embodiment methods is used instead of the conventional high spin speed (i.e., 2400 RPMs), the charge induced in the semiconductor wafer 12 is significantly reduced (−8+ vs. −4). Indeed, in an embodiment the charge is reduced by about 43%.

It should be recognized that use of the disclosed methods to clean and/or dry the semiconductor wafer 12 provides numerous advantages. For example, instances of wafer defects and wafer charging are each reduced. Moreover, the high surface dry efficiency improves cycle time for the semiconductor manufacturing process.

In an embodiment, a method of cleaning and drying a semiconductor wafer includes inserting a semiconductor wafer into a chamber of a cleaning tool, spinning the semiconductor wafer at less than about 1600 revolutions per minute, and spraying the semiconductor wafer with isopropyl alcohol.

In an embodiment, a method of cleaning and drying a semiconductor wafer includes inserting a semiconductor wafer into a chamber of a cleaning tool, spinning the semiconductor wafer in a range of about 300 revolutions per minute to about 500 revolutions per minute while spraying the semiconductor wafer with de-ionized water, discontinuing spraying the semiconductor wafer with the de-ionized water, and spinning the semiconductor wafer at about 1600 revolutions per minute or less while spraying the semiconductor wafer with a mixture of isopropyl alcohol and nitrogen.

In an embodiment, a method of cleaning and drying a semiconductor wafer includes inserting a semiconductor wafer into a chamber of a cleaning tool, spinning the semiconductor wafer at about 300 revolutions per minute while spraying the semiconductor wafer with de-ionized water and a mixture of isopropyl alcohol and nitrogen, discontinuing spraying the semiconductor wafer with the de-ionized water and the mixture of isopropyl alcohol and nitrogen, and spinning the semiconductor wafer in a range of about 1200 revolutions per minute and about 1600 revolutions per minute.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of cleaning and drying a semiconductor wafer, the method comprising:
   inserting a semiconductor wafer into a chamber of a cleaning tool;
   spinning the semiconductor wafer at 300 revolutions per minute while simultaneously starting a spraying of the semiconductor wafer with de-ionized water from a first inlet and a mixture of isopropyl alcohol and nitrogen from a second inlet;
   repositioning the second inlet within the chamber, wherein the second inlet is fully disposed outside lateral extents of the semiconductor wafer while simultaneously starting the spraying of the semiconductor wafer;
   discontinuing the spraying of the semiconductor wafer with the de-ionized water and the mixture of isopropyl alcohol and nitrogen; and
   after discontinuing the spraying of the semiconductor wafer, spinning the semiconductor wafer in a range of 1200 revolutions per minute to 1600 revolutions per minute while the semiconductor wafer is not sprayed with any fluid.

2. The method of claim 1, further comprising spinning the semiconductor wafer at 1000 revolutions per minute while spraying the semiconductor wafer with the de-ionized water prior to the step of spinning the semiconductor wafer at 300 revolutions per minute while spraying the semiconductor wafer with the de-ionized water and a mixture of isopropyl alcohol and nitrogen.

3. The method of claim 2, further comprising spinning the semiconductor wafer at 300 revolutions per minute while spraying the semiconductor wafer with the de-ionized water prior to the step of spinning the semiconductor wafer at 1000 revolutions per minute while spraying the semiconductor wafer with the de-ionized water.

4. The method of claim 1, wherein the mixture of isopropyl alcohol and nitrogen is sprayed on the semiconductor wafer in a range of between 10 standard liters per minute and 90 standard liters per minute.

5. The method of claim 1, further comprising moving the second inlet such that the mixture of isopropyl alcohol and nitrogen is sprayed on the semiconductor wafer from at least one or more than one location and more than one angle.

6. The method of claim 1, wherein the cleaning tool is employed in one of a chemical mechanical planarization cleaning process and a chemical vapor deposition scrubber process.

7. The method of claim 1, wherein spinning the semiconductor wafer in a range of 1200 revolutions per minute to 1600 revolutions per minute comprises spinning the semiconductor wafer at about 1400 revolutions per minute.

8. A method of cleaning and drying a semiconductor wafer, the method comprising:
   inserting a semiconductor wafer into a chamber of a cleaning tool;
   simultaneously spinning the semiconductor wafer at a first rate and spraying the semiconductor wafer with de-ionized water;
   simultaneously spinning the semiconductor wafer at a second rate and spraying the semiconductor wafer with de-ionized water, the second rate being greater than the first rate;
   simultaneously spinning the semiconductor wafer at a third rate and simultaneously starting a spraying of the semiconductor wafer from a first nozzle with de-ionized water and from a second nozzle with a mixture of isopropyl alcohol and nitrogen, the first nozzle disposed within lateral extents of the semiconductor wafer while simultaneously starting the spraying of the semiconductor wafer, moving the second nozzle within the chamber, wherein the second nozzle is fully disposed outside the lateral extents of the semiconductor wafer while simultaneously starting the spraying of the semiconductor wafer, the third rate being less than the second rate, wherein the semiconductor wafer is not sprayed between the spraying with de-ionized water while spinning the semiconductor wafer at the second rate and the spraying the semiconductor wafer with de-ionized water and the mixture of isopropyl alcohol and nitrogen;
   discontinuing the spraying of the semiconductor wafer with de-ionized water and the mixture of isopropyl alcohol and nitrogen;
   after discontinuing the spraying of the semiconductor wafer, spraying de-ionized water onto edges of the semiconductor wafer; and
   after the spraying the edges of the semiconductor wafer, spinning the semiconductor wafer at a fourth rate while the semiconductor wafer is not sprayed with de-ionized water, isopropyl alcohol, or nitrogen, the fourth rate being greater than the second rate.

9. The method of claim 8, further comprising, prior to the simultaneously spinning the semiconductor wafer at the first rate and spraying the semiconductor wafer with de-ionized water, performing a chemical mechanical planarization (CMP) process.

10. The method of claim 8, further comprising altering a spraying angle while spraying the mixture of isopropyl alcohol and nitrogen.

11. The method of claim 8, wherein the cleaning tool is a chemical vapor deposition (CVD) scrubber.

12. The method of claim 8, wherein the de-ionized water is provided by a first inlet and the mixture of isopropyl alcohol and nitrogen is provided by a second inlet.

13. The method of claim 12, further comprising altering a position of the second inlet while spraying the mixture of isopropyl alcohol and nitrogen provided by the second inlet.

14. The method of claim 8, wherein the second rate is moo revolutions per minute.

15. The method of claim 8, wherein the third rate is 300 revolutions per minute.

16. The method of claim 8, wherein the first rate is 300 revolutions per minute.

17. A method of cleaning and drying a semiconductor wafer, the method comprising:
- inserting a semiconductor wafer into a chamber of a cleaning tool;
- spinning the semiconductor wafer at 300 revolutions per minute while simultaneously starting a spraying of the semiconductor wafer with de-ionized water from a first inlet and a mixture of isopropyl alcohol and nitrogen from a second inlet, wherein the first inlet is disposed within lateral extents of the semiconductor wafer;
- repositioning the second inlet within the chamber, wherein the second inlet is fully disposed outside the lateral extents of the semiconductor wafer while simultaneously starting the spraying of the semiconductor wafer;
- discontinuing the spraying of the semiconductor wafer with the de-ionized water and the mixture of isopropyl alcohol and nitrogen; and
- after discontinuing the spraying of the semiconductor wafer, spinning the semiconductor wafer in a range of 1200 revolutions per minute to 1600 revolutions per minute while the semiconductor wafer is not sprayed with any fluid.

18. The method of claim 17, further comprising spinning the semiconductor wafer at 1000 revolutions per minute while spraying the semiconductor wafer with the de-ionized water prior to the step of spinning the semiconductor wafer at 300 revolutions per minute while spraying the semiconductor wafer with the de-ionized water and a mixture of isopropyl alcohol and nitrogen.

19. The method of claim 18, further comprising spinning the semiconductor wafer at 300 revolutions per minute while spraying the semiconductor wafer with the de-ionized water prior to the step of spinning the semiconductor wafer at 1000 revolutions per minute while spraying the semiconductor wafer with the de-ionized water.

20. The method of claim 17, wherein after discontinuing the spraying of the semiconductor wafer, spinning the semiconductor wafer at about 1400 revolutions per minute while the semiconductor wafer is not sprayed with any fluid.

21. The method of claim 17, further comprising spraying de-ionized water onto edges of the semiconductor wafer after discontinuing the spraying of the semiconductor wafer with the de-ionized water and the mixture of isopropyl alcohol and nitrogen.

22. The method of claim 21, wherein the de-ionized water is sprayed onto the edges of the semiconductor wafer before spinning the semiconductor wafer in the range of 1200 revolutions per minute to 1600 revolutions per minute.

* * * * *

UNITED STATES PATENT AND TRADEMARK OFFICE
CERTIFICATE OF CORRECTION

| | |
|---|---|
| PATENT NO. | : 10,043,653 B2 |
| APPLICATION NO. | : 13/595787 |
| DATED | : August 7, 2018 |
| INVENTOR(S) | : Wei-Cheng Chen |

It is certified that error appears in the above-identified patent and that said Letters Patent is hereby corrected as shown below:

In the Claims

In Column 7, Line 9, Claim 14, delete "moo" and insert --1000--.

Signed and Sealed this
Second Day of October, 2018

Andrei Iancu
*Director of the United States Patent and Trademark Office*